United States Patent [19]
Barton et al.

[11] Patent Number: 5,264,699
[45] Date of Patent: Nov. 23, 1993

[54] INFRARED DETECTOR HYBRID ARRAY WITH IMPROVED THERMAL CYCLE RELIABILITY AND METHOD FOR MAKING SAME

[75] Inventors: Jeffrey Barton; Arthur H. Lockwood, both of Goleta, Calif.

[73] Assignee: Amber Engineering, Inc., Goleta, Calif.

[21] Appl. No.: 658,985

[22] Filed: Feb. 20, 1991

[51] Int. Cl.⁵ .................... G01J 5/20; H01L 27/14
[52] U.S. Cl. .................... 250/338.4; 250/332; 250/370.09; 250/370.13; 437/3; 437/5; 257/436; 257/442; 257/460; 257/469
[58] Field of Search .......... 250/338.4, 370.09, 370.13, 250/332; 357/30

[56] References Cited

U.S. PATENT DOCUMENTS

| | | | |
|---|---|---|---|
| H894 | 3/1991 | Halvis | 437/3 |
| 3,577,631 | 5/1971 | Bylander et al. | |
| 3,794,883 | 2/1974 | Bylander et al. | |
| 3,900,865 | 8/1975 | Schaefer | |
| 4,374,678 | 2/1983 | Castro | 357/16 |
| 4,411,732 | 10/1983 | Wotherspoon | |
| 4,779,004 | 10/1988 | Tew et al. | |
| 5,047,645 | 9/1991 | Gundjian et al. | 250/338.4 |
| 5,075,201 | 12/1991 | Koh | 430/321 |

*Primary Examiner*—Stephen C. Buczinski
*Attorney, Agent, or Firm*—Graham & James

[57] ABSTRACT

A hybrid infrared focal plane array detector employs a thinned detector layer and substrate directly bonded to a conventional semiconductor readout integrated circuit substrate. The infrared detector layer and transparent substrate is thinned to a thickness of approximately 25–400μ to allow the detector to act like a flexible membrane to elastically respond to thermal mismatch due to differing coefficients of thermal expansion between the detector and semiconductor readout circuit as the hybrid device is cooled from manufacturing at room temperature to cryogenic operation temperatures. By thinning the detector substrate to a desired thickness, essentially unlimited hybrid detector sizes may be obtained. Additionally, the detector layer and substrate may be divided into sub-arrays to provide further resistance to stress induced from thermal mismatch.

25 Claims, 5 Drawing Sheets

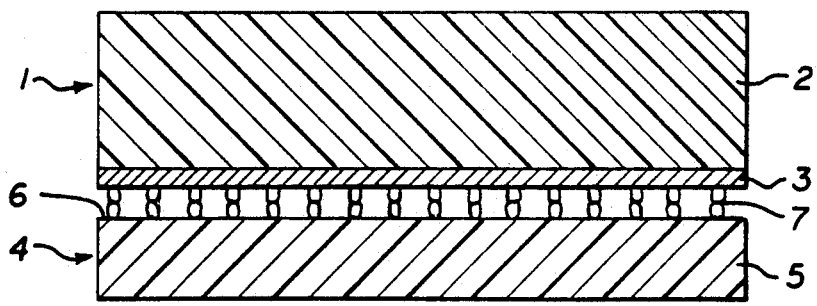
*FIG. 1*
*PRIOR ART*
*FIG. 2*
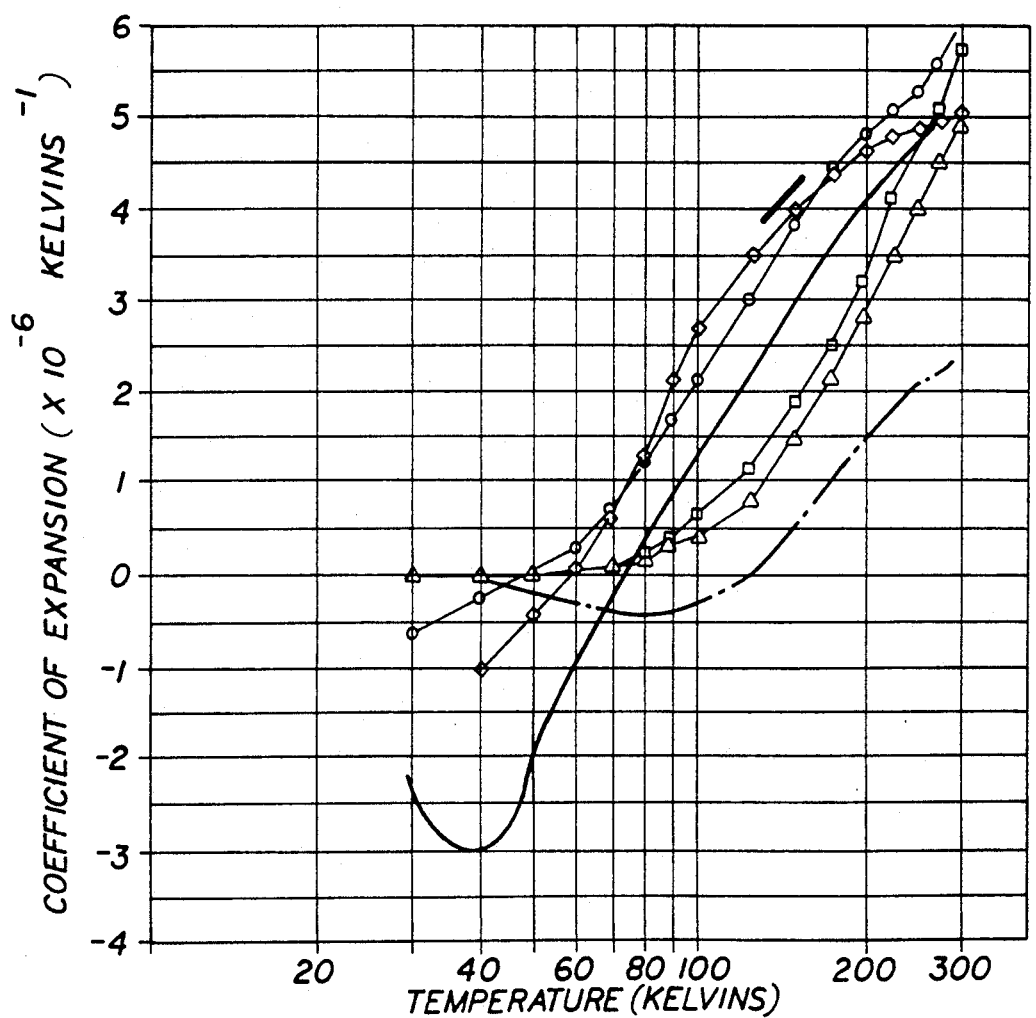

INFRARED DETECTOR HYBRID ARRAY WITH IMPROVED THERMAL CYCLE RELIABILITY AND METHOD FOR MAKING SAME

BACKGROUND OF THE INVENTION

1. Field of the Invention

The present invention relates to infrared detector hybrid arrays. More particularly, the present invention relates to infrared detector hybrid arrays including an infrared detector array mounted on a silicon readout circuit.

2. Description of the Prior Art and Related Information

Space based infrared detection systems are of significant technological importance for both military and civilian space based monitoring applications. High performance infrared detection systems, typically referred to as infrared focal plane arrays, employ an infrared detector array mounted on a readout circuit. The detector array may typically employ a thin layered detector material, chosen adapted for the infrared frequency range to be monitored, formed monolithically on a suitable substrate transparent to infrared radiation in the frequency range desired. An array of photodiodes is formed in the thin layer of detector material. This detector array is then directly mounted on a readout circuit which is typically a conventional silicon integrated circuit having the necessary circuitry for picking up the signals detected by the detector array, amplifying them and processing them for the specific monitoring application.

Referring to FIG. 1, a conventional prior art hybrid infrared detector array is illustrated in cross-section. The conventional hybrid array includes a monolithic detector array 1 which includes, for example, a cadmium-telluride (CdTe) substrate 2 with a relatively thin active infrared detection layer 3 of HgCdTe on one major surface thereof. The infrared detector array 1 is "bump-bonded" to a readout circuit 4. The readout circuit 4 will typically be manufactured using conventional integrated circuit semiconductor processing technology and will thus have a silicon substrate 5 with the desired readout circuit formed on the upper surface 6 thereof. The conventional "bump-bonding" technique employs indium interconnects 7. These indium bumps 7, provide both the electrical interconnects between the infrared detector array 1 and the silicon readout circuit 4, as well as providing bonding between the detector array 1 and readout circuit 4. An epoxy bonding material (not shown) is also commonly employed to further bond the detector array 1 and readout circuit 4.

The indium bump bonded hybrid detector array, such as illustrated in FIG. 1, has the advantage that relatively large two-dimensional arrays may be fabricated. Additionally, the indium bump bonding technique provides low resistance and low capacitance interconnection between the detector 1 and the readout circuit 4.

One significant disadvantage of the prior art infrared detector array of FIG. 1, however, is the lack of reliability introduced by virtue of the difference in the temperature coefficient of thermal expansion between the detector array 1 and the readout circuit 4. More specifically, the hybrids are manufactured at room temperature under zero stress but operated at very low temperatures, typically less than 100° K. As a result, considerable stress is introduced at the junction of the detector 1 and the readout circuit 4 due to the thermal mismatch. The significance of this problem may be appreciated by comparing the coefficients of expansion of various materials potentially involved in such hybrids through the temperature range of 30°–300° K., as illustrated in FIG. 2. As will be appreciated from FIG. 2, a significant difference in the coefficient of expansion exists between silicon, HgTe and CdTe throughout most of this temperature range.

In practice, the thermal mismatch problem manifests itself as either physical damage in the hybrid array or degraded performance. The physical damage may manifest itself as either local or global delamination of the hybrid, i.e., actual separation of the indium bumps between the detector and readout circuit, or cracking of the detector array. The performance degradation may manifest itself as lack of uniformity between arrays, within an array, or as a general reduction in performance specifications. Additionally, the magnitude of the thermal mismatch problem is directly proportional to the size of the array. For example, for arrays of one inch by one inch, more than 17 microns of mismatch exists between the silicon readout circuit and a HgCdTe detector array after cooling from room temperature to a cryogenic temperature of about 77° K. As a result, in practice the size of hybrid arrays have been limited to about 0.25 inches by 0.25 inches by the thermal mismatch and associated reliability problems. This limitation in size has occurred despite the key advantage of large arrays for infrared detection sensitivity and spatial resolution capability.

Several attempts have been employed in the prior art to attempt to overcome the thermal mismatch problem and allow increased size detector arrays. One such approach has been to employ taller indium bumps 7, the taller bumps allowing some lateral bending of the bumps to accommodate the thermal mismatch before delamination or cracking occurs. Although this approach can provide some reduction in the thermal mismatch problem for smaller arrays, it is inherently limited in its application to larger arrays, for example, much greater than about 0.3 inches by 0.2 inches. Also, where the hybrid array is required to be back filled with epoxy to provide adequate bonding between the detector array and the readout circuit, the use of taller indium bumps is not a viable solution. This will typically limit the use of indium bump bonding with taller columns to applications where an epitaxial detector layer, such as HgCdTe is formed on a detector substrate such as CdTe. Furthermore, such approach has not proven to be viable in applications requiring long term reliability, having multiple thermal cycles, and/or high G force environments.

In another approach, the thermal mismatch problem has been reduced somewhat by the deletion of the epoxy used to bond the detector array and silicon readout circuit together. In particular, some improvement is provided when this is combined with taller indium bumps to allow the bumps to flex somewhat to accommodate the thermal mismatch. Although this approach may be suitable for laboratory demonstrations of hybrid arrays, since the epoxy is not present to strengthen the bond between the array and readout circuit, the resultant hybrid is quite susceptible to delamination since only the indium bonds provide the bonding. Therefore, the stress introduced during handling and assembly, and in space based applications, where high G forces and/or high vibration will be present, makes this approach unsuitable in practice.

Another approach to the thermal mismatch problem has been to employ a substrate which has a closer thermal coefficient of expansion to silicon as the substrate for the infrared detector active layer. For example, sapphire has been employed as a substrate for HgCdTe epitaxial detector layers to provide an improved thermal match with the silicon readout circuit. As may be appreciated from FIG. 2, sapphire has a much closer coefficient of expansion to silicon than does CdTe, the more common detector substrate. Nonetheless, some mismatch in the coefficient of expansion does exist between sapphire and silicon, leading to at most a reduction, not an elimination of the thermal mismatch problem. Also, the use of a sapphire substrate for the detector array has resulted in reduced detection performance levels. As a result, the use of alternate substrates for the detector array has not proven to be an adequate solution to the thermal mismatch problem.

Accordingly, none of the existing approaches to reducing or eliminating the thermal mismatch problem are suitable for solving the problem in applications involving desired large arrays in applications such as space based monitoring where large G forces and high vibration will be present. Accordingly, a need presently exists to provide a solution to the thermal mismatch problem in a manner which is practical for such desired applications.

SUMMARY OF THE INVENTION

The present invention provides an improved infrared detector hybrid array having significantly reduced susceptibility to the problems associated with thermal mismatch between the detector array and the silicon readout circuit.

Additionally, the present invention provides a method for manufacturing such an improved, thermal mismatch resistant, detector array in a manner which is readily compatible with existing manufacturing techniques.

The present invention provides a hybrid infrared detector array employing a detector array, having a thin active detector layer formed on a thin transparent detector substrate, mounted on a conventional silicon readout circuit. The present invention exploits the relationship between the elasticity of the detector array and the thickness of the array. Accordingly, for a sufficiently thin detector array, sufficient elasticity is provided so that the differential expansion characteristics of the detector array and the silicon readout circuit may be absorbed by the elasticity of the thin detector array. In a preferred embodiment, an active infrared detector layer of mercury-cadmium-telluride (HgCdTe) is provided on a transparent substrate of cadmium-telluride (CdTe) with the total thickness of the HgCdTe/CdTe detector array being reduced to approximately 2 mils in thickness from a conventional 35 mil thickness. The HgCdTe/CdTe detector array is bonded to the silicon readout circuit in a conventional manner, employing an indium bump bonding interconnection and an epoxy back-fill to securely bond the two substrates. Due to the thin nature of the HgCdTe/CdTe substrate, it acts effectively as a membrane complying with the much thicker silicon readout circuit substrate during cooling of the hybrid from room temperature to application temperature of less than 100° K. Although a thickness of approximately 2 mils for the detector/transparent substrate will provide significantly increased resistance to thermal mismatch problems for large arrays, the thickness may be further reduced for larger arrays or increased for smaller arrays. For example, a detector array thickness of less than about 17 mils will provide resistance to thermal mismatch problems for hybrids of 0.5 inches by 0.5 inches size, or less.

The present invention further provides a method for manufacturing an infrared hybrid detector array having improved resistance to thermal mismatch problems, in a manner readily compatible with conventional manufacturing techniques. In a preferred embodiment, the infrared detector array portion of the hybrid is fabricated in a conventional manner, as is the silicon readout circuit, prior to bonding. For example, the active infrared detection layer may be epitaxially grown on a transparent substrate to form a HgCdTe/CdTe detector. This conventional active detector substrate is then indium bump bonded to the silicon readout chip, preferably also employing an epoxy back-fill to further increase the bonding of the two substrates, in a conventional manner. The detector portion of the hybrid array is then thinned, via lapping, diamond turning, chemical etching, or polishing techniques, to a desired thickness. Thus, the manufacturing of the hybrid infrared detector array may proceed in a completely conventional manner with the addition of a polishing, lapping, etching or diamond turning step to thin the active detector substrate.

In an alternate embodiment, the surface of the active detector substrate, having the epitaxial layer of active infrared detector material thereon, may be etched into an array pattern by forming recessed trenches in the surface. The depth of the trenches is chosen such that after the bump bonding and lapping steps, the trenches extend through the remaining detector substrate, thereby separating the detector array into a plurality of smaller arrays. This results in a further reduction in stress due to thermal mismatch, with only an additional etching step and no reduction in device performance.

Accordingly, it will be appreciated that the present invention provides an improved infrared hybrid detector array and method having significantly reduced susceptibility to thermal mismatch problems. It will be further appreciated that the present invention provides the capability to produce larger infrared hybrid detector arrays with an associated increase in the performance characteristics of such larger arrays. It will be further appreciated that the present invention provides such improvements without requiring a significant increase in processing steps and without requiring any new processing technology. Further features and advantages of the present invention will be appreciated by those of ordinary skill in the art by review of the following detailed description of the invention.

BRIEF DESCRIPTION OF THE DRAWINGS

FIG. 1 is a cross-sectional view of a prior art hybrid infrared focal plane array.

FIG. 2 is a chart illustrating the thermal coefficients of expansion for several materials employed in hybrid infrared focal plane arrays through the temperature range of 30° K.–300° K.

DETAILED DESCRIPTION OF THE INVENTION

Figure 3:
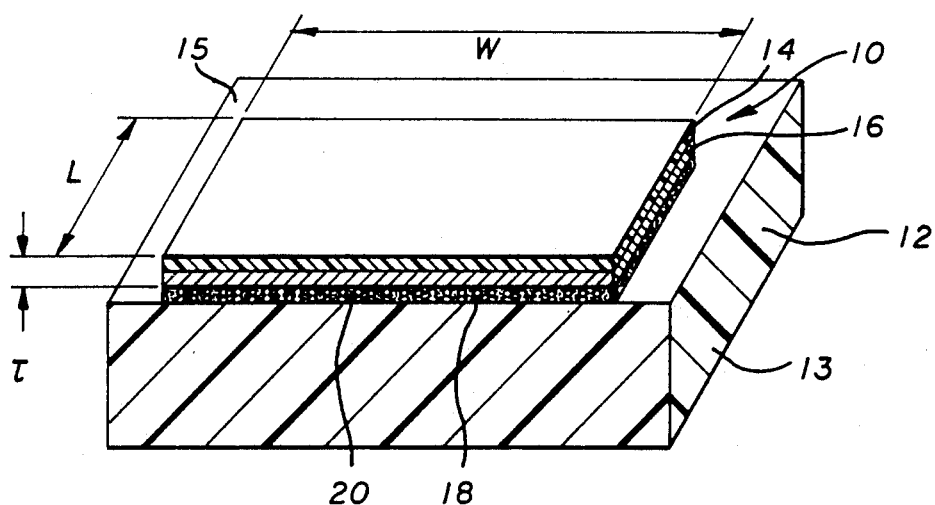
FIG. 3 is a top schematic view of an improved hybrid focal plane array in accordance with the present invention.

Referring to FIG. 3, a preferred embodiment of the hybrid infrared focal plane array of the present invention is illustrated in a perspective/cross-sectional view. As illustrated in FIG. 3, the hybrid infrared focal plane array detector of the present invention employs a thin infrared detector array portion 10 bonded to a readout circuit 12. Readout circuit 12 may be completely conventional in nature and will preferably employ a silicon substrate 13 to allow conventional silicon semiconductor processing of the readout circuit. The readout circuitry is thus formed as an integrated circuit on upper major surface 15 of silicon substrate 13. Since the construction of the readout circuit 12 is completely conventional in nature, and varies with the specific application, details of its specific construction will be omitted herein. It will be appreciated, however, that other types of readout circuits may also be employed, for example, gallium-arsenide circuits may be employed, such circuits also suffering from the thermal mismatch problem in conventional hybrid focal plane arrays.

The infrared detector array portion 10, illustrated in FIG. 3, employs a thin transparent substrate 14 and a thin active infrared detection layer 16 formed into an array of active photodiodes (not shown). As will be discussed in more detail below, the active infrared detection layer 16 and the photodiodes formed therein may be conventional in nature. In a preferred embodiment, the transparent substrate 14 may be composed of cadmium-telluride (CdTe) with the active infrared detection layer 16 being an epitaxial layer of mercury-cadmium-telluride (HgCdTe). It will be appreciated, however, that other well known materials may also be employed for the transparent substrate 14 and active layer 16, for example, a suitable combination of substrate 14 and active layer 16 may include any combination of Zn, Cd or Hg with any combination of Te or Se. The ratio of the various constituents forming the active layer and the substrate are chosen to obtain the required properties. For example, a HgZnTe active layer may be grown on a CdSeTe substrate with similar properties to HgCdTe grown on CdTe if the ratio of the constituents are properly chosen according to known guidelines. The specific materials (or ratio of constituents) selected will depend upon the frequency of infrared radiation desired to be detected for the specific application of the hybrid infrared focal plane array. The infrared detector 10 is bonded to the upper surface 15 of silicon readout circuit 12 through indium bump interconnects 18 and epoxy bonding material 20.

As illustrated in FIG. 3, although FIG. 3 is not drawn to scale, the infrared detector array portion 10 is much thinner than the silicon readout circuit 12. This is in contrast to conventional hybrid detector arrays of this type wherein the detector and silicon readout circuit are of approximately the same thickness, typically about 35 mils. In the hybrid detector array of the present invention, in contrast, the detector 10 has a thickness $\tau$ which is much thinner than that of silicon readout circuit 12, for example, in the range of 2-17 mils. This reduction in the thickness of the infrared detector array portion 10 is achieved by reducing the thickness of the transparent substrate 14, with the active infrared detector layer 16 having approximately the same thickness as in conventional detector arrays. This significantly reduced thickness of the substrate 14 of the infrared detector array portion 10 provides an elastic characteristic to the detector array portion 10 which allows the detector array portion 10 to substantially conform with the changes in size of the silicon substrate 12 during cryogenic cooling, to thereby eliminate stresses introduced by the thermal mismatch of the two materials. As discussed below in relation to FIG. 4, the specific thickness of substrate 14, and hence thickness $\tau$ of detector array portion 10, is interrelated with the size of the overall hybrid, i.e., the size L×W of the detector array portion 10.

The desired thickness of the detector 10 illustrated in FIG. 3, for a desired hybrid device size may be obtained through a relatively simple calculation. More specifically, assuming a one-dimensional analysis of the stress induced on the detector array portion 10 by virtue of the thermal mismatch, e.g., considering only the stress on a surface taken along the length direction L in FIG. 3, the following relation may be derived:

$$STRESS = F/S = FORCE/CROSS\text{-}SECTIONAL\ AREA$$

$$STRAIN = \delta\xi/\delta x = INCREASE\ IN\ LENGTH/ORIGINAL\ LENGTH$$

$$STRESS/STRAIN = (F/S)/(\delta\xi/\delta x) = -Y[YOUNGS\ MODULUS]\ (by\ definition)$$

$$F = -SY(\delta\xi/\delta x) = -SY\alpha\delta T$$

$$\therefore F = -\tau L Y\alpha\delta T \tag{1}$$

where:
  $\alpha$ = difference in thermal coefficient of expansion between silicon and the detector/substrate;
  $\alpha\delta T = \delta\xi/\delta x$ by definition;
  $\tau$ = HgCdTe plus substrate thickness; and
  L = side length of array.

Figure 4:
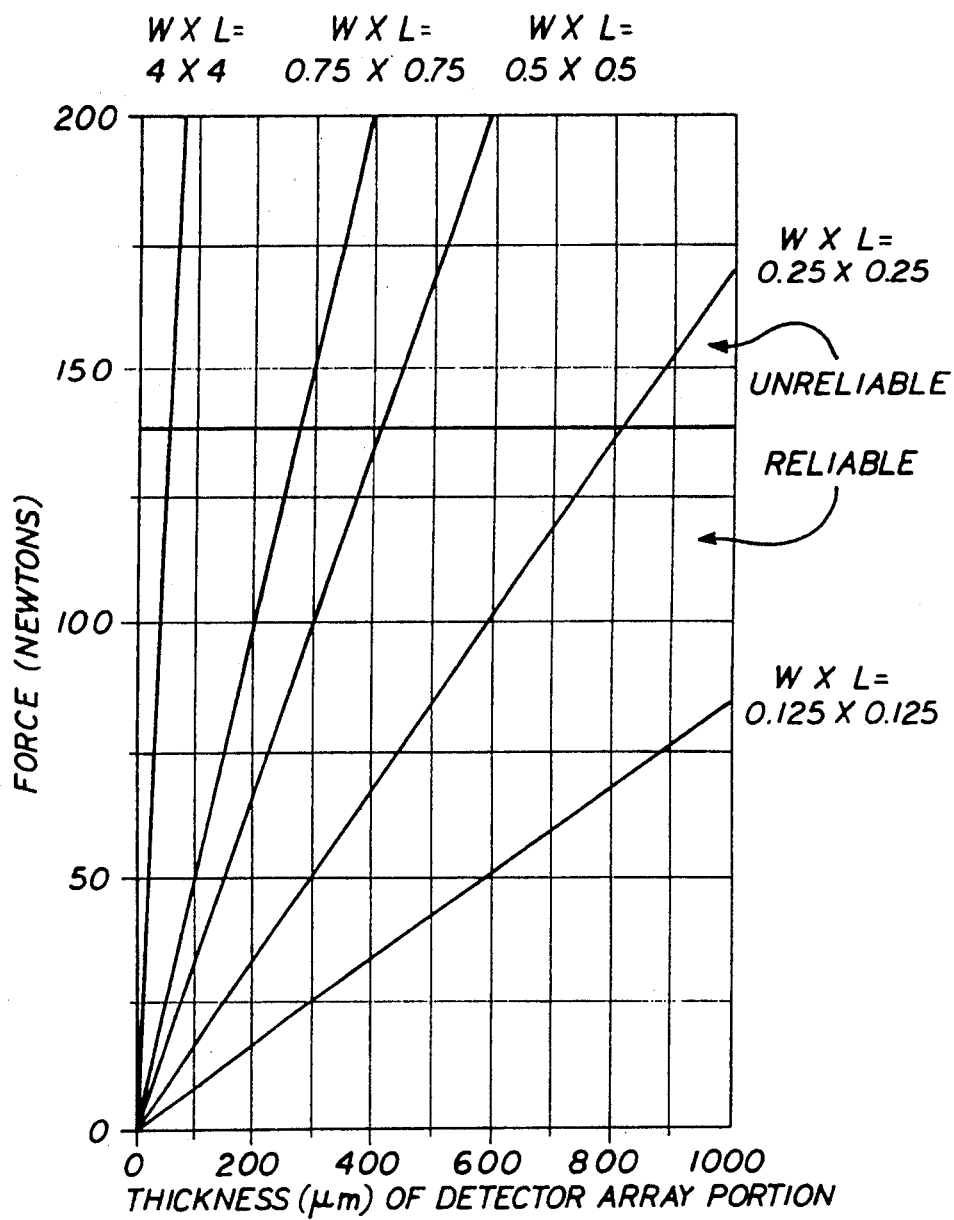
FIG. 4 is a graph illustrating the force versus thickness relationship exploited by the present invention for various sized hybrid infrared focal plane arrays.

For a preferred embodiment employing a HgCdTe infrared detector 10 on silicon readout circuit 12, taking the following values for $\alpha$ and Y:

$$\alpha(silicon) = 1 \times 10^{-6}/°C.;$$

$$\alpha(HgCdTe) = 4 \times 10^{-6}/°C;\ and$$

$$Y(HgCdTe) = 4 \times 10^{10}[N/M^2],$$

the relations obtained in FIG. 4 are obtained for five specific examples of the surface area of the detector 10, where L=W=4 inches, 0.75 inches, 0.5 inches, 0.25 inches and 0.125 inches, respectively. FIG. 4 further assumes that the hybrid detector array is assembled at room temperature and then cooled to 77° K. The resulting force on the hybrid array as a function of thickness (in microns) for various detector sizes is illustrated in FIG. 4.

Also shown in FIG. 4 is a division of the force on the hybrid due to thermal mismatch into reliable and unreliable segments, indicating the force beyond which the reliability of the hybrid would be unacceptable for most practical applications. The force division between reliable and unreliable at 135 Newtons is based on empirical results with conventional hybrid infrared focal plane arrays having a detector thickness of 30-35 mils. FIG. 4 also clearly shows that the size of the hybrid directly affects the force due to thermal mismatch. Thus, as may be seen from FIG. 4, a 0.25 inch by 0.25 inch hybrid is approximately the largest possible size for a thickness of 32 mils employing conventional hybrid detectors (approximately 800μ). Thus, 0.25 inches by 0.25 inches has represented the largest practical size for conventional hybrid arrays.

Referring to FIG. 4, it will be readily appreciated that the force on the hybrid due to thermal mismatch is reduced linearly as the thickness of the detector array portion 10 is reduced. By employing the thin infrared detector array portion of the present invention, the detector size may be substantially increased while receiving the same reliability obtained in the thicker conventional hybrids. For example, as shown in FIG. 4, for an infrared detector array portion having a thickness of approximately 400μ, a reliable 0.5 inch by 0.5 inch hybrid size may be achieved. Since the only restraint on the amount of thinning of the infrared detector array portion is the necessary lower thickness limit of the active infrared detection layer 16 of approximately 1 mil (25μ), it may be seen from inspection of FIG. 4 that very large hybrids may be made without being constrained by thermal mismatch problems. Therefore, as also shown in FIG. 4 hybrids having a detector array portion thickness from about 25μ to 225μ will be reliable for large hybrids, up to about 0.75 inch by 0.75 inch in size. Alternatively, for a given hybrid size, the thinned detector array portion of the present invention provides a significantly improved reliability to thermal mismatch problems, thereby improving performance of the hybrid array.

Figure 5A:
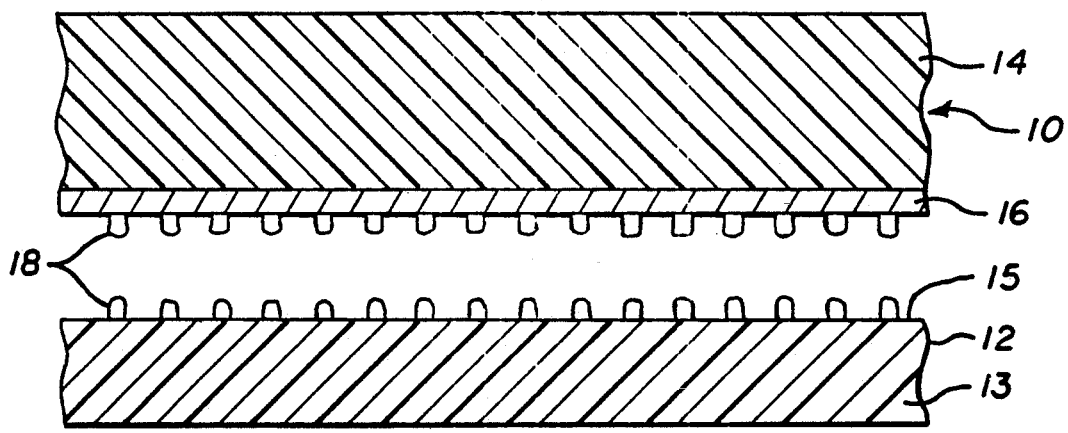
FIGS. 5(a), 5(b) and 5(c) illustrate the method for fabricating an improved infrared hybrid focal plane array in accordance with the present invention.
Figure 5B:
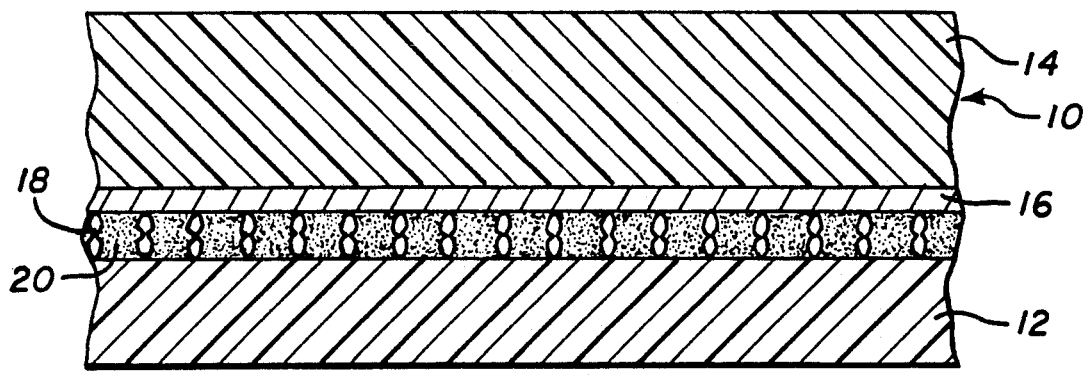
Figure 5C:
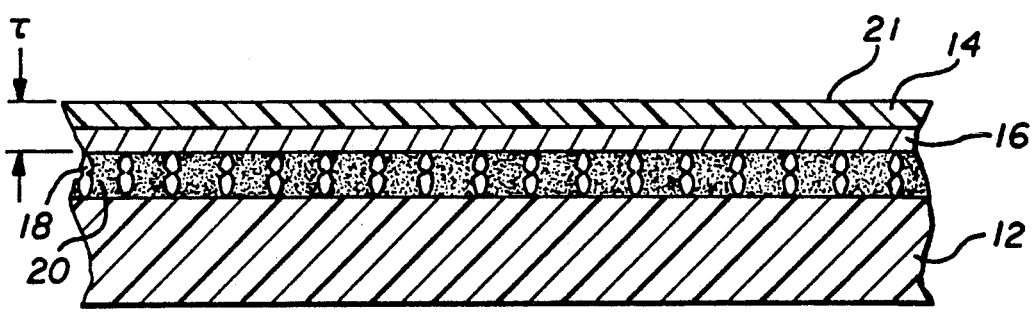

Referring to FIGS. 5(a)-5(c), a preferred method of fabrication of the hybrid infrared detector array of the present invention is illustrated. As shown in FIG. 5(a), the method for forming the hybrid array of the present invention may commence with a conventional detector array portion 10 and silicon readout circuit 12. Detector array portion 10 may preferably employ a HgCdTe active layer 16, of a thickness of approximately 1 mil (25μ), epitaxially formed on an infrared transparent CdTe substrate 14. For ease of manufacturing and handling, the CdTe substrate 14 may be of a conventional thickness of approximately 35 mils. Active layer 16 may be formed on substrate 14 through any suitable epitaxial growth technique, for example, liquid phase epitaxy, with a stoichiometry chosen for the wavelength of infrared radiation to be detected; i.e., formed with a chemical composition $Hg_{1-x}Cd_xTe$, where x may vary from 0 to 1 to thereby adjust the bandgap of the material and hence the infrared detection wavelength sensitivity. As the detector array 10 is completely conventional to this point, it will be appreciated by those skilled in the art that other substrates may also be employed instead of CdTe, having suitably transparent characteristics to the infrared wavelength to be detected. For example, a substrate of CdZnTe or CdSeTe may equally be employed. Furthermore, other active layers may also be employed, including for example, super-lattice structures formed by molecular epitaxy techniques on the substrate 14. The silicon readout circuit 12 is also conventional, having a desired readout circuit formed through conventional integrated circuit techniques on the upper surface 15 of the silicon substrate 13. Also shown in FIG. 5(a) are indium bump interconnects 18 formed in a conventional manner on the major surfaces of both detector array portion 10 and silicon readout circuit 12.

Referring to FIG. 5(b), the hybrid infrared detector array is shown after the detector 10 and silicon readout circuit 12 have been indium bump bonded together. Since the thickness of the detector array portion 10 is conventional at this stage, this step may also proceed in a conventional manner without any handling difficulties introduced by a thinned detector 10. Also as shown in FIG. 5(b), an additional epoxy bonding material 20 has been back-filled into the space between detector array portion 10 and silicon readout chip 12 to further increase the bonding between the two and thereby strengthen the hybrid.

Referring to FIG. 5(c), the hybrid infrared detector array of the present invention is illustrated after the transparent CdTe substrate 14 has been thinned to a desired thickness from the approximately 35 mil thickness illustrated in FIGS. 5(a) and 5(b). As discussed above, the thickness τ of detector array portion 10 will be chosen to achieve the desired reliability for a specified hybrid size, generally in accordance with the relations illustrated in FIG. 4. Thinning from the 35 mil conventional thickness of the substrate 14 to the substantially reduced thickness may be done using well known lapping and polishing techniques. Preferably, a first lapping step will reduce the detector array portion 10 to approximately the desired thickness τ, and is followed by a more accurate polishing step to provide an even upper surface 21 of detector array portion 10 and a precise tolerance for the thickness τ across the device surface. Alternative diamond turning methods may be employed to thin the transparent substrate 14 to provide the desired thickness τ for the detector array portion 10.

Accordingly, it will be appreciated that the method of fabrication of the improved hybrid detector array of the present invention involves only conventional manufacturing techniques, and only adds an additional thinning step to a conventional hybrid manufacturing process. Since this step is done after the assembly of the detector array portion 10 and the silicon readout chip 12, no difficulty in handling is introduced by the thinness of the detector array portion 10. Furthermore, since the epoxy bonding material may be employed with the present invention without sacrificing the thermal reliability characteristics of the hybrid, the hybrid will retain good strength and resistance to vibration and G forces despite the thin detector array portion 10.

Figure 6:
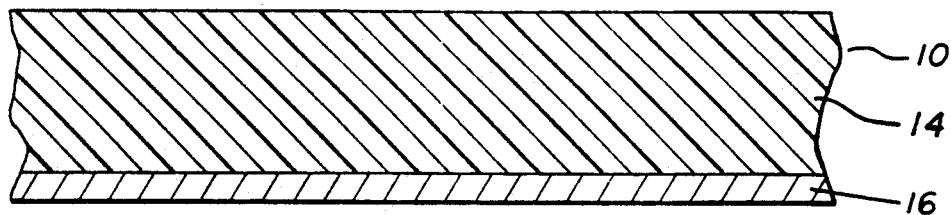
FIGS. 6(a), 6(b), 6(c) and 6(d) illustrate a method for fabricating an improved hybrid infrared focal plane array in accordance with an alternate embodiment of the present invention.
Figure 6:
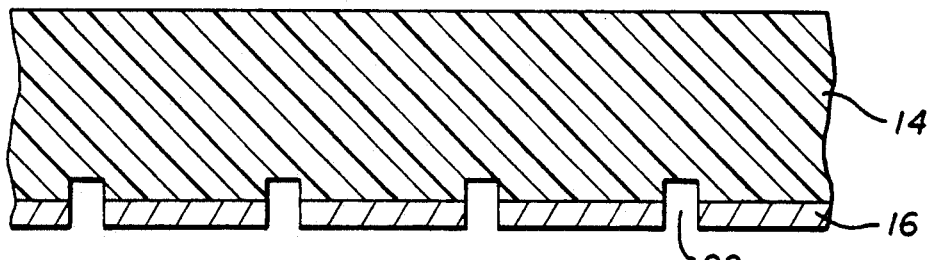
Figure 6:
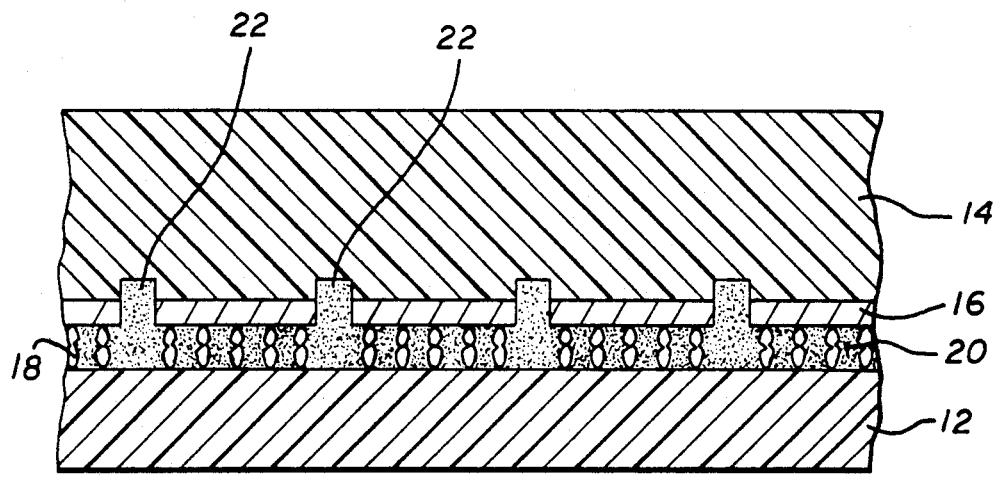
Figure 6:
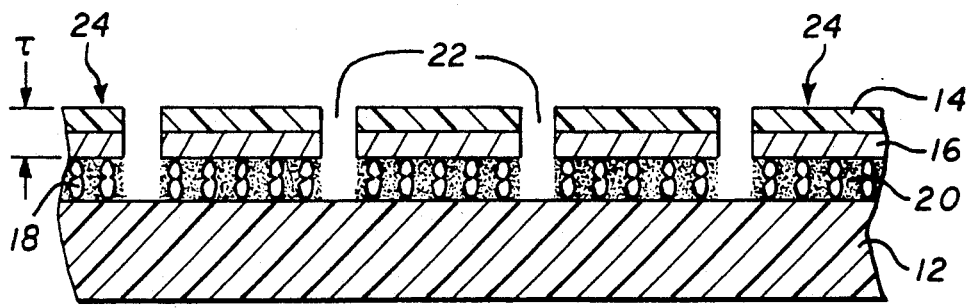

Referring to FIGS. 6(a)-6(d), a method for fabricating a hybrid infrared focal plane array in accordance with an alternate embodiment of the present invention is illustrated. In FIG. 6(a), the detector array portion 10 is illustrated as in FIG. 5(a) and may also be completely conventional at this stage. In FIG. 6(b), the detector array portion 10 is illustrated after an etching step has been performed so as to etch channels 22 through the active layer 16 and into the transparent CdTe substrate 14. As shown more clearly in FIG. 7, channels 22 are chosen so as to divide the active surface of the detector array 10 into a number of sub-arrays with cross channels. The channels 22 are etched to a depth slightly exceeding the thickness τ to which the detector array portion 10 will be thinned.

Referring to FIG. 6(c), the hybrid array is illustrated after the detector array portion 10 and silicon circuit 12 have been indium bump bonded together in an otherwise conventional manner employing indium bumps 18 and after an epoxy material 20 has been back-filled into the space between the detector array portion 10 and silicon readout chip 12.

In FIG. 6(d), the hybrid array of the present invention is illustrated after the detector array portion 10 has been lapped and polished to a thickness $\tau$ less than the depth of channels 22. Thus, as may be seen, the detector array portion 10 is separated into isolated sub-arrays 24 each including a number of photodiodes (not shown). Channels 22 are cleared of epoxy through an epoxy dissolving solution so as to leave the sub-arrays 24 completely independent laterally. As a result, each sub-array 24 is securely, but independently, bonded to the readout circuit 12.

Figure 7:
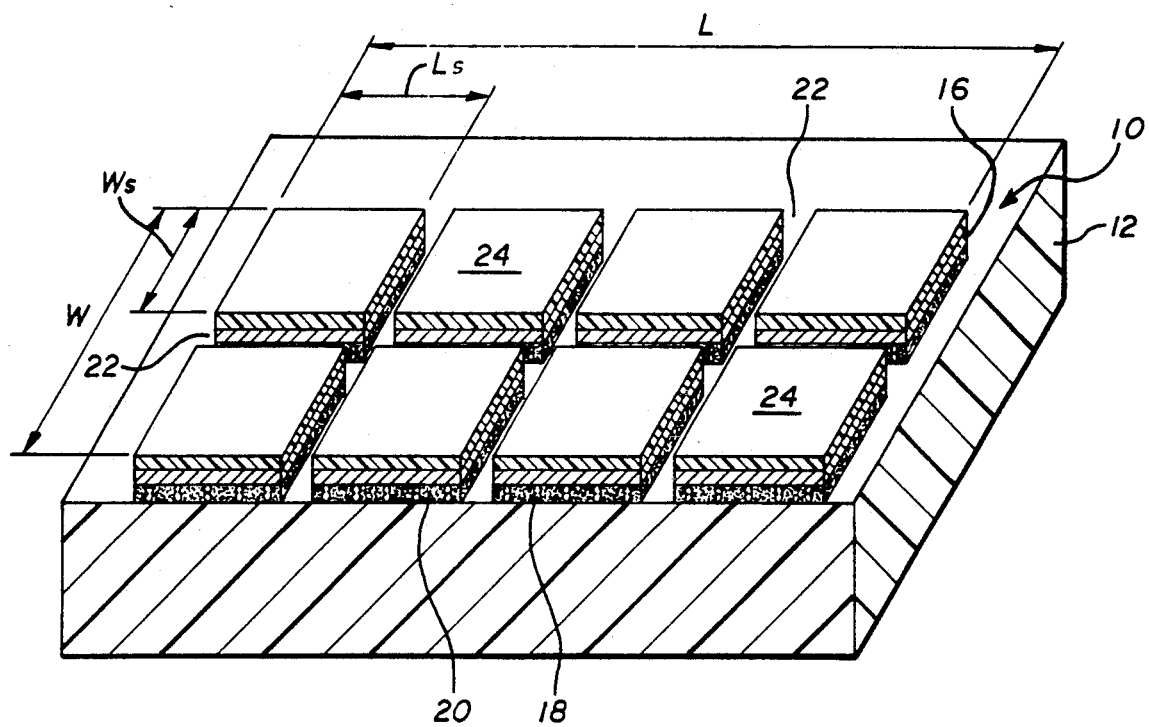
FIG. 7 is a top perspective view of an alternate embodiment of the improved infrared hybrid focal plane array of the present invention.

In FIG. 7, a top perspective view is shown of the hybrid detector array of the alternate embodiment described with respect to FIGS. 6(a)-6(d). Since the detector subarrays 24 are completely isolated from one another laterally, the effective size for the purposes of thermal mismatch effects is reduced to the size of the individual arrays 24. Thus, the force due to mismatch on each subarray 24 is effectively that corresponding to one of the lower curves in FIG. 4, thereby significantly reducing the force on the overall hybrid. For example, if the overall size W×L of the hybrid shown in FIG. 7 is 0.5 inches by 0.5 inches, whereas the size of the sub-array $W_S \times L_S$, is 0.125 inches by 0.125 inches, the applicable curve in FIG. 4 would be reduced from the 0.5 inch by 0.5 inch curve to that of the 0.125 inch by 0.125 inch curve, with the corresponding increase in reliability for a given thickness $\tau$. This is achieved without any decrease in the strength of the hybrid and with only the addition of a straight forward etching step to the overall fabrication of the hybrid.

Accordingly, it will be appreciated that the infrared hybrid focal plane array of the present invention and method of making the same provides a hybrid array with a significantly reduced susceptibility to thermal mismatch problems resulting from cooling the hybrid from room temperature to cryogenic temperatures. Such reduction in susceptibility in thermal mismatch problems allows hybrids of practically unlimited size to be fabricated, with such size limitations only coming from the fabrication process limitations resulting from non-thermal mismatch effects. Furthermore, the performance of the hybrid infrared detector of the present invention is not compromised with respect to the conventional hybrid detectors as opposed to alternate approaches employing alternate, less desirable substrates, since conventional substrate material and active device layers may be employed. Furthermore, the present invention allows the use of an epoxy bonding interface between the detector array and readout circuit, resulting in a strong hybrid, resistant to detrimental effects of handling, vibration and high G force environments, encountered in typical applications. Furthermore, the method of the present invention employs preexisting well known fabrication techniques and does not require any complex processing steps to be introduced into the hybrid manufacturing process.

While the foregoing description of the preferred embodiments have been described for presently preferred materials and geometries, it will be readily appreciated by those skilled in the art that the present invention is equally compatible with a variety of different materials, different readout circuits, and different geometries of the hybrid. Furthermore, the process of fabricating the hybrid detector of the present invention may be also varied to take advantage of various processing techniques well known to those skilled in the art. Accordingly, the present invention should not be limited to the preferred embodiments described above.

What is claimed is:

1. A hybrid infrared detector array, comprising:
   a silicon substrate including a readout circuit formed on an upper major surface of the silicon substrate; and
   an infrared detector array portion including an active infrared detection layer formed under a transparent infrared substrate, said detector array portion being bonded to the upper major surface of said silicon substrate so as to be electrically connected with said readout circuit, said detector array portion having a thickness of between about $25\mu$ and $225\mu$.

2. A hybrid infrared detector array as set out in claim 1, wherein said transparent infrared substrate is composed of a material selected from the group consisting of CdTe, CdZnTe, and CdSeTe, and wherein said active infrared detection layer is composed of HgCdTe.

3. A hybrid infrared detector array as set out in claim 1, wherein the infrared detector array has a major surface area of approximately 0.5 inches by 0.5 inches.

4. A hybrid infrared detector array as set out in claim 1, wherein said detector array portion and said silicon substrate are bonded together through indium electrical connection bonding bumps and epoxy bonding material interspersed between said indium bonding bumps.

5. A hybrid infrared detector array as set out in claim 1, wherein said active infrared detection layer includes a plurality of infrared photodiode structures.

6. A hybrid infrared detector array as set out in claim 1, wherein said detector array portion is divided into a plurality of detector sub-arrays, separated from each other by a plurality of channels.

7. A hybrid infrared detector array as set out in claim 4, wherein said detector array portion is approximately 0.5 inches by 0.5 inches in surface area and wherein said subarrays are approximately 0.125 inches by 0.125 inches or less in surface area.

8. A hybrid infrared detector array as set out in claim 6, wherein said detector array portion has a surface area of approximately 0.75 inches by 0.75 inches and said detector sub-arrays have a size of approximately 0.125 inches by 0.125 inches.

9. A hybrid infrared detector array as set out in claim 1, wherein said infrared transparent substrate is a compound semiconductor material with one or more component compounds selected from the group consisting of Zn, Cd, or Hg in combination with Te or Se.

10. A hybrid infrared detector array as set out in claim 1, wherein said active infrared detector layer is a compound semiconductor material with one or more component compounds selected from the group consisting or Zn, Cd or Hg in combination with Te or Se, said component compounds being selected to provide a band gap energy corresponding to the wavelength of the infrared radiation to be detected.

11. A hybrid infrared detector array as set out in claim 9, wherein said compound semiconductor material of said infrared transparent substrate is CdSeTe and said active infrared detection layer is a compound composed of HgZnTe.

12. A method for forming a hybrid infrared detector, comprising the steps of:
   providing an infrared readout circuit formed in a semiconductor integrated circuit substrate;
   mounting an infrared detector portion to the infrared readout circuit substrate, said infrared detector portion having an active infrared detection layer formed under an infrared transparent substrate; and
   thinning the infrared transparent substrate to provide a thickness of about 25–225µ for the infrared detector portion.

13. A method for forming a hybrid infrared detector as set out in claim 12, wherein said step of thinning comprises lapping the transparent substrate to approximately the desired thickness followed by polishing the transparent substrate to the desired thickness.

14. A method as set out in claim 12, wherein said infrared transparent substrate is composed of a material selected from the group consisting of CdTe, CdZnTe, and CdSeTe and wherein said active infrared detection layer is composed of HgCdTe.

15. A method as set out in claim 12, wherein said infrared transparent substrate has a major surface area of approximately 0.5 inches by 0.5 inches.

16. A method as set out in claim 12, wherein said step of thinning the infrared transparent substrate comprises employing diamond turning the substrate to a desired thickness.

17. A method as set out in claim 12, wherein said infrared transparent substrate is a compound semiconductor material with one or more component compounds selected from the group consisting of Zn, Cd or Hg in combination with Te or Se.

18. A method as set out in claim 12, wherein said active infrared detection layer is a compound semiconductor material with one or more component compound selected from the group consisting of Zn, Cd or Hg in combination with Te or Se.

19. A method as set out in claim 17, wherein said infrared transparent substrate is composed of CdSeTe and said active infrared detection layer is composed of HgZnTe.

20. A method for forming a hybrid infrared detector array, comprising the steps of:
   providing an active infrared detection layer on an infrared transparent substrate to form an infrared detector portion;
   etching a plurality of channels through the active infrared detection layer into said transparent substrate;
   providing a readout circuit formed on an upper major surface of a semiconductor substrate;
   mounting the infrared detector portion on the upper major surface of said semiconductor substrate; and,
   after said mounting step,
   thinning the infrared transparent substrate to a thickness less than the depth of said channels.

21. A method as set out in claim 20, wherein said step of providing an active infrared detection layer on an infrared transparent substrate comprises depositing a desired active detector layer material through liquid phase epitaxy on a infrared transparent substrate.

22. A method as set out in claim 21, wherein said step of providing an active infrared detection layer comprises providing an active infrared detection layer of approximately 25µ thickness formed on an infrared transparent substrate of approximately 875µ thickness.

23. A method as set out in claim 20, wherein said step of mounting said infrared detector portion on said semiconductor substrate comprises indium bump bonding the infrared detector portion to said semiconductor substrate.

24. A method as set out in claim 23, wherein said step of mounting further comprises providing an epoxy bonding layer between said indium bump bonds.

25. A method as set out in claim 24, further comprising the step, after said step of thinning the infrared transparent substrate, of removing the epoxy bonding material in said channels.

* * * * *